(12) United States Patent
Zenko et al.

(10) Patent No.: US 6,515,216 B2
(45) Date of Patent: Feb. 4, 2003

(54) PHOTOVOLTAIC DEVICE ASSEMBLY, SOLAR CELL MODULE USING THE SAME AND MANUFACTURE METHOD OF SOLAR CELL MODULE

(75) Inventors: Hideaki Zenko, Kanagawa (JP); Ichiro Kataoka, Nara (JP); Satoru Yamada, Nara (JP); Hidenori Shiotsuka, Nara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/897,031

(22) Filed: Jul. 3, 2001

(65) Prior Publication Data
US 2002/0038663 A1 Apr. 4, 2002

(30) Foreign Application Priority Data
Jul. 6, 2000 (JP) ........................... 2000-204486
Jun. 13, 2001 (JP) ........................... 2001-178242

(51) Int. Cl.[7] ................ H01L 31/05; H01L 31/042
(52) U.S. Cl. ................ 136/244; 136/251; 257/443; 257/464; 257/459; 438/66; 438/67; 438/80
(58) Field of Search .................. 136/244, 251; 257/443, 464, 459; 438/66, 67, 80

(56) References Cited

U.S. PATENT DOCUMENTS

| | | | | |
|---|---|---|---|---|
| 3,268,366 A | * | 8/1966 | Guyot | 136/244 |
| 4,249,959 A | * | 2/1981 | Jebens | 136/244 |
| 5,011,544 A | * | 4/1991 | Gaddy et al. | 136/246 |

FOREIGN PATENT DOCUMENTS

| | | |
|---|---|---|
| JP | 7-193266 | 7/1995 |
| JP | 8-64852 | 3/1996 |
| JP | 9-70886 | 3/1997 |
| JP | 10-65194 | 3/1998 |

* cited by examiner

Primary Examiner—Alan Diamond
(74) Attorney, Agent, or Firm—Fitzpatrick, Cella, Harper & Scinto

(57) ABSTRACT

The present invention provides a photovoltaic device assembly comprising a plurality of photovoltaic devices connected with one another, wherein no rectangular corner part is formed in the peripheral parts of the photovoltaic device assembly itself and the shape of the peripheral parts of the photovoltaic devices is composed of straight lines and curved lines connecting the straight lines to one another, thereby preventing penetration owing to the effects of manufacture, installation, transportation, handling, and the state after installation of the solar cell module.

27 Claims, 9 Drawing Sheets

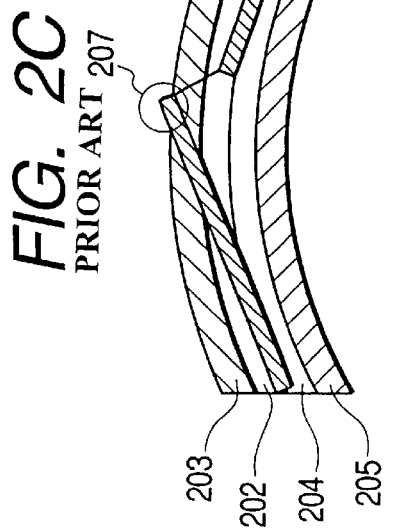
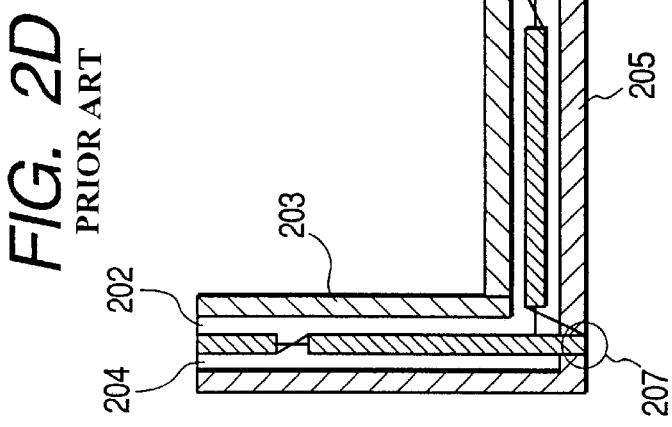
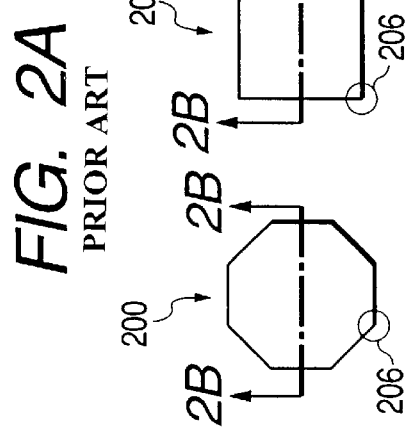
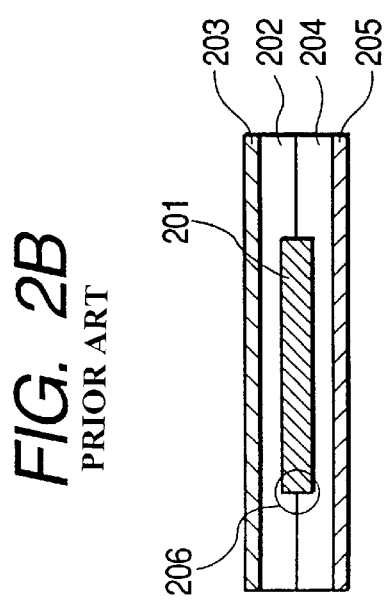

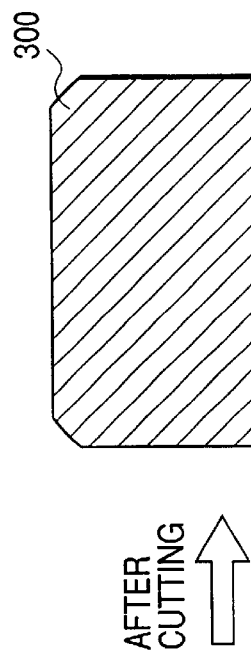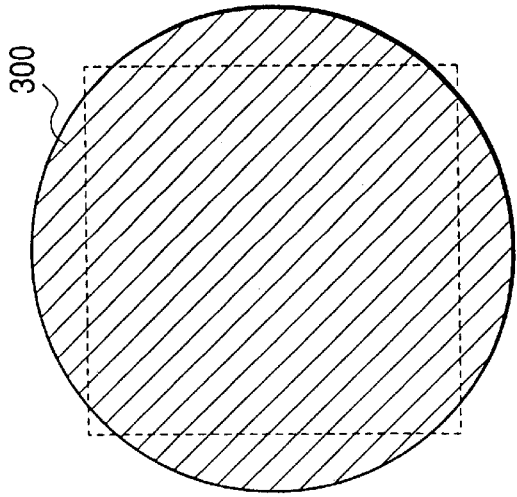
FIG. 3
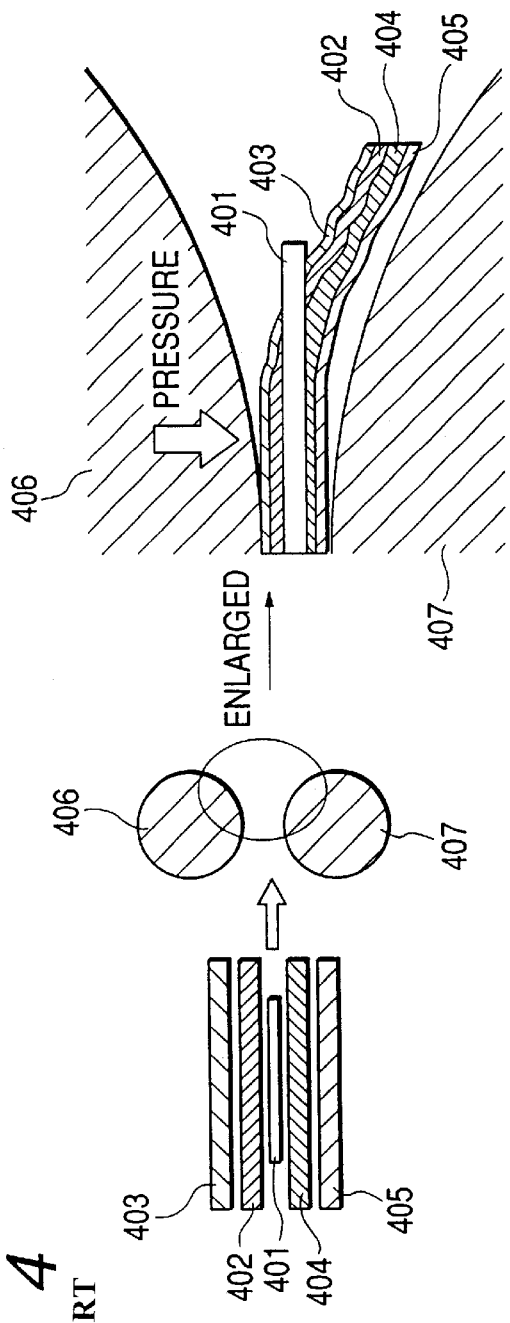
FIG. 4 PRIOR ART

PHOTOVOLTAIC DEVICE ASSEMBLY, SOLAR CELL MODULE USING THE SAME AND MANUFACTURE METHOD OF SOLAR CELL MODULE

BACKGROUND OF THE INVENTION

1. Field of the Invention

The present invention relates a photovoltaic device assembly, a solar cell module using the assembly and a manufacture method of the module and more particularly relates to a solar cell module in which the photovoltaic device assembly built therein is prevented from the penetrating phenomenon (a phenomenon the photovoltaic device assembly tears a coating material) and a manufacture method of the module.

2. Related Background Art

Recently, environmental issues have increasingly drawn attention and people have tended to be awaken to the matter in the world. Above all, the apprehensions about the global warming phenomenon following $CO_2$ emission have been serious and therefore development of clean energy has highly been expected.

Further, in the situation where draining of energy resources has become a big issue, a new energy source has been required to be urgently developed. Today, as such a substituting energy source, a solar cell can be said to be an expected clean energy source owing to its safeness and easiness to be handled.

A variety of embodiments of a solar cell are available and the representative ones are as follows:

(1) a single crystal silicon solar cell;
(2) a polycrystalline silicon solar cell;
(3) an amorphous silicon solar cell (in this patent application, the definition also includes a microcrystalline solar cell);
(4) a copper indium selenide solar cell;
(5) a compound semiconductor solar cell; and the like.

Among them, a thin film crystalline silicon solar cell, a compound semiconductor solar cell, and an amorphous silicon solar cell have recently been subjected to active investigation and development in a wide sphere since they are possible to be developed at relatively low costs and to have a large surface area.

Conventionally, a constitution of a module composed of such solar cells and shown in FIG. 1 is representatively known. That is, the module is one obtained by sealing a photovoltaic device assembly 101 with a surface filler 102 and a back filler 104 in the outermost back face member 105 and coating the front face with a transparent outermost surface member 103. Further, in the case where the outermost back face member 105 has the conductivity just like a metal steel plate, an insulating material such as an electrically insulating film represented as a polyethylene terephthalate (PET) and nylon is used between the outermost back face member 105 and the photovoltaic device assembly 101.

In a solar cell module with such a constitution, generally, grass or a transparent polymer material such as a fluororesin film, an acrylic resin film and the like is used for the outermost surface member 103 and glass materials, steel sheets, hard plastics, flexible films and the like are used for the outermost back face member 105. Further, as the surface filler 102 and the back filler 104, those usable are organic resin compositions such as ethylene vinyl acetate copolymers (EVA), ethylene (meth)acrylic acid ester copolymers, ethylene (meth)acrylic acid copolymers, polyvinyl butyral (PVB) and the like.

Among them, a solar cell module using a transparent polymer material for the outermost surface member 103 and a flexible material for the outermost back face member 105 has flexibility and is light in weight and highly impact resistant as compared with that using glass for the outermost surface member.

Differing from a general solar cell equipped with a glass cover, such a solar cell module having flexibility can optionally be changed in forms. For example, if the outermost back face member 105 is made of a steel material, it is possible to curve corresponding to the flat faces and curved faces of a building and thus the solar cell module is suitable as those united with a building material. Further if the outermost back face member 105 is made of a flexible film, different from the case of using the steel material, the option of the form change is increased and the weight is light, so that the solar cell module obtained is possible to be easily attached to sheet-type outdoor leisure goods and portable goods and thus to be used in a variety of purposes.

On the other hand, the foregoing solar cell module having flexibility is inferior in durability to scratching as compared with that using glass for the outermost surface member and possible to be damaged of the element due to scratching or the like from the outside and damages of element are possible to considerably deteriorate the electric properties of the solar cell module and corrosion of metals used for the element may be promoted by permeation of water through the damaged portion. As a method for preventing such damages, there are adopted a method of adding to the surface filler 102 a reinforcing material such as the glass fiber materials and a method of increasing the hardness of the surface filler 102.

As described above, particularly in the solar cell module having flexibility, various countermeasures have so far been proposed in relation to the protection method of a photovoltaic device from the outside force.

On the other hand, it has not so much been discussed regarding a practical protection method of a solar cell module from rupture and damages attributed to the internal force of the solar cell module as compared with the protection method of a photovoltaic device from the outside face.

The rupture and damages of a solar cell module attributed to the internal force of the solar cell module are phenomena as follows.

For example, if a flexible material such as a polymer material and the like is used for the outermost surface member 103 as described before, attributed to the effects of installation, transportation, handling, and further the situation after installation of a solar cell module, a photovoltaic device assembly 101 sealed in the solar cell module penetrates the outermost surface member 103 to deteriorate the appearance of the solar cell module and further that sometimes results in material deterioration by water penetration from the torn parts in the case where the penetration takes place after installation of the solar cell module in outdoors. The same takes place also in the case where the outermost back face member 105 is a polymer material.

Such penetration is affected by a manufacture method of a solar cell module and more particularly by a lamination method for sealing the photovoltaic device assembly with the outermost surface member, the outermost back face member, and the fillers.

Generally known as a lamination method for a solar cell module are a vacuum lamination method by a double vacuum or a single vacuum chamber method, a roll lamination method using a roll laminator. In a manufacture method of a solar cell module using a flexible polymer material for either one or both of the outermost surface member 103 and the outermost back face member 105, manufacture methods using flexible materials by the roll lamination method are disclosed in Japanese Patent Application Laid-Open No. 7-193266, Japanese Patent Application Laid-Open No. 8-64852, Japanese Patent Application Laid-Open No. 9-70886, Japanese Patent Application Laid-Open No. 10-65194. As compared with a vacuum heating method, these methods make it possible to continuously supply a material, to improve the mass productivity, and to lower the manufacturing cost.

However, in the case of employing the roll lamination method, as compared with other methods, the above described penetration phenomenon of the photovoltaic device assembly tends to take place rather frequently.

The effect of the penetration of the photovoltaic device assembly affects not only the quality and the manufacture method of a solar cell module. Workers may possibly be injured and hurt if the photovoltaic device assembly is being protruded out the coating material.

Taking the above described situation into consideration, the present invention is to provide a photovoltaic device assembly from protruding attributed to the manufacture, the installation, the transportation, the handling, and the situation after the installation of a solar cell module and further to provide a photovoltaic device assembly with improved safeness at the time of handling the photovoltaic device assembly itself, to provide a solar cell module excellent in long-term reliability and to provide a manufacture method of the solar cell module.

Inventors of the present invention have repeatedly made investigations of the penetration phenomenon of a photovoltaic device assembly attributed to the internal force of a solar cell module in order to solve the above described problems and found the following.

(1) The penetration phenomenon occurs considerably depending on the shape of a photovoltaic device assembly.
(2) The penetration phenomenon is most noticeable in the peripheral parts of photovoltaic device assemblies arranges in series or in parallel in a solar cell module.
(3) In the case where a photovoltaic device assembly has a shape having a rectangular corner, the corner part is sharply projected. FIGS. 2A to 2D are diagrammatic figures showing such a state and FIG. 2A is a plan view of a solar cell module, FIG. 2B is a cross-section figure cut along the line 2B to 2B in FIG. 2A, FIG. 2C shows the solar cell module while being curved, and FIG. 2D shows the solar cell module being bent. As being shown in the figures, if the solar cell module 200 is curved or bent, the force generated at that time is converged upon the corner part 206 of the photovoltaic device assembly 201 to cause the phenomenon that the photovoltaic device assembly 201 penetrates the outermost surface member 203, the outermost back face member 205 and the fillers 202, 204. The reference numeral 207 shows the part penetrated with a photovoltaic device.
(4) Especially, in the case where a metal is used for the substrate of a photovoltaic device constituting a photovoltaic device assembly, the rupturing force which the projected part has is intense and the damage of a solar cell module by the penetration is considerably serious.

Incidentally, the shape of the peripheral parts of the photovoltaic device assembly is determined by each of the photovoltaic devices composing the photovoltaic device assembly and the shapes of these photovoltaic devices differ depending also on the embodiments of the solar cells. For example, the shape of a photovoltaic device to be used for a single crystal silicon solar cell depends on the single crystal silicon wafer shape and a CZ method (a Czochralski method) is employed as its production method. The single crystal silicon wafer is obtained by cutting a silicon ingot produced by the CZ method, and the cross-section of the wafer is circular. In the case of a circular shape, there is no possibility to cause the foregoing penetration, however the charging efficiency of the photovoltaic devices to be packed in the solar cell module tends to be deteriorated and it may results in a problems of enlargement of the solar cell module and the cost up of the module. For that, the shape of the single crystal silicon wafer is processed as shown in FIG. 3 to improve the charging efficiency and consequently, the peripheral parts of the photovoltaic device assembly in which photovoltaic devices are arranged in series or in parallel are so formed as to have rectangular corner parts to possibly cause the penetration phenomenon.

Further the reason for that the penetration phenomenon noticeably takes place in a roll lamination method which is preferable to be employed as a manufacture method of a solar cell module using a flexible polymer material for either one or both of the outermost surface member and the outermost back face member has been found owing to the following. It will be described with reference to FIG. 4. In this drawing, the reference numeral 401 denotes a photovoltaic device assembly, 402 a surface filler, 403 an outermost surface member, 404 a back filler, 405 an outermost back face member, 406 and 407 a heating and pressurizing upper roll and lower roll of a roll laminator apparatus.

It is attributed to that the roll lamination method is quite different from a vacuum heating method in a thermal compression bonding method. That is, in the case where a roll laminator is used, heat and pressure are applied partially to a layered body of a solar cell module before the thermal compression bonding. In this case, as shown in FIG. 4, local compression bonding takes place in the boundary parts of the parts where the photovoltaic device assembly 401 is sandwiched and the parts where no photovoltaic device assembly 401 exists in the layered body, so that the penetration of the outermost surface member 403 and the outermost back face member 405 is possibly caused in the peripheral parts of the photovoltaic device assembly 401. The yield ratio is also deteriorated by such penetration.

The penetration phenomenon by the photovoltaic device assembly is sometimes affected by shapes of bus bar electrodes, connection electrodes, and terminal-leading out electrodes which are disposed on the photovoltaic device assembly. That is, as shown in FIG. 5A and FIG. 5B, if rectangular corner parts exist in bus bar electrodes 503 extended to the peripheral parts of the photovoltaic device assembly 500 (500a, 500b), connection electrodes 504 for connecting the bus bar electrodes one another to connect the photovoltaic devices in series or in parallel, and terminal-leading out electrodes 505, as similar to the rectangular corner part 506 of the photovoltaic devices 501, these rectangular corner parts of these electrodes are probable to penetrate the outermost surface member or the outermost back face member depending on the thickness and the hardness of the connection electrodes and the like.

SUMMARY OF THE INVENTION

The present invention is achieved based on the above described findings of inventors of the present invention, constituted as following, and has purposes to prevent a photovoltaic device or the like from penetrating a coating material.

For such a purpose, the present invention provides a photovoltaic device assembly comprising a plurality of photovoltaic devices connected with one another, wherein no rectangular corner part is formed in the peripheral parts of the photovoltaic device assembly itself and the shape of the peripheral parts of the photovoltaic devices is composed of straight lines and curved lines connecting the straight lines to one another.

Further, the present invention provides a solar cell module comprising a photovoltaic device assembly which comprises a plurality of photovoltaic devices connected with one another and which is coated with a coating material, wherein no rectangular corner part is formed in the peripheral parts of the photovoltaic device assembly itself and the shape of the peripheral parts of the photovoltaic devices is composed of straight lines and curved lines connecting the straight lines to one another.

Further, the present invention provides a manufacture method of a solar cell module comprising a photovoltaic device assembly which comprises a plurality of photovoltaic devices connected with one another and which is coated with a coating material, wherein the photovoltaic device assembly has no rectangular corner part formed in the peripheral parts and the shape of the peripheral parts of the photovoltaic devices is composed of straight lines and curved lines connecting the straight lines to one another and the photovoltaic device assembly and the coating material are thermally compression bonded with each other by a roll lamination method.

In this case, it is preferable that no rectangular corner part is formed in the peripheral parts of the photovoltaic devices. Respectively neighboring two straight lines among the straight lines constituting the shape of the peripheral parts of the photovoltaic devices form 100° or narrower interior angle at the crossing point of their extended lines. It is also preferable for the photovoltaic device assembly to have electrode tabs having no rectangular corner parts in the peripheral parts. The foregoing electrode tabs are each preferably any one of a bus bar electrode, a connection electrode, and a terminal-leading out electrode. The thickness of the photovoltaic devices is preferably 50 µm or thicker. The substrate of each photovoltaic device is preferable to be an inorganic material. The substrate is preferable to have flexibility. The coating material is preferable to comprise a outermost surface member, a outermost back face member, and fillers. The outermost surface member is preferably of a polymer material.

BRIEF DESCRIPTION OF THE DRAWINGS

FIGS. 2A, 2B, 2C, and 2D are illustrations for illustrating the penetration phenomenon of a photovoltaic device assembly.

FIG. 3 is an illustration showing the processing of a single crystal silicon wafer to be used for a single crystal solar cell.

FIG. 4 is a figure for illustrating the penetration phenomenon of a photovoltaic device taking place at the time of manufacturing a solar cell module by a roll lamination method.

DETAILED DESCRIPTION OF THE PREFERRED EMBODIMENTS

Hereinafter, embodiments of the present invention will be described.

Figure 1:
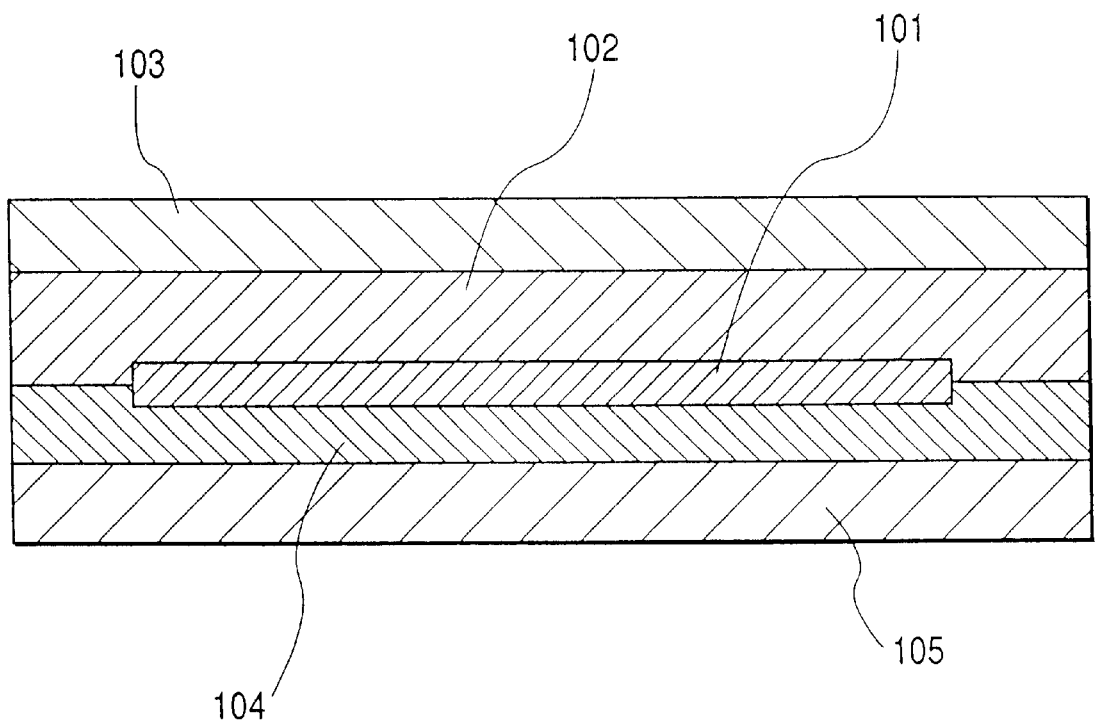
FIG. 1 shows one example of a diagrammatic cross-section figure of a general solar cell module.

The basic constitution of a solar cell module of the present invention is as same as shown in FIG. 1. That is, the solar cell module is composed of a photovoltaic device assembly 101, a surface filler 102, a outermost surface member 103, a back filler 104, and a outermost back face member 105.

Figure 6A:
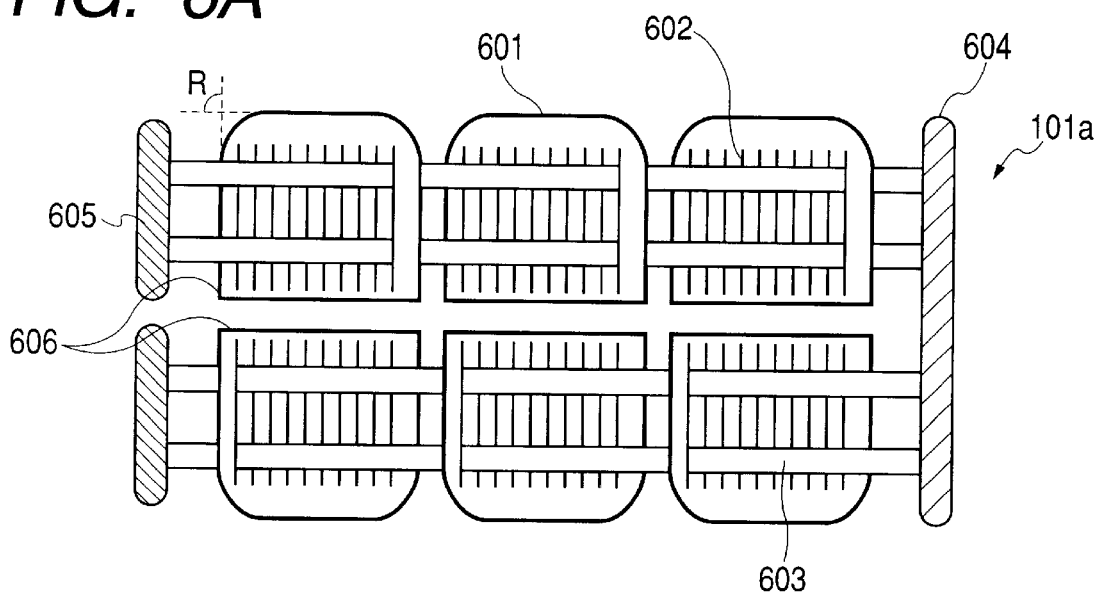
FIGS. 6A, 6B and 6C are plan views schematically showing some shape examples of photovoltaic device assemblies according to the present invention.
Figure 6B:
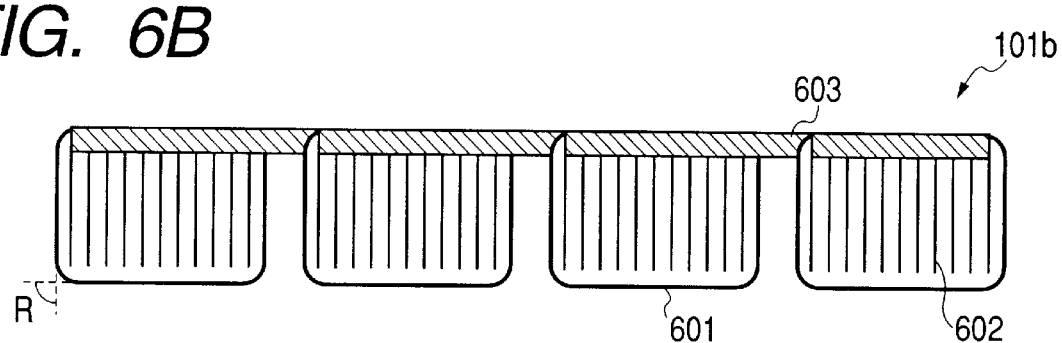
Figure 6C:
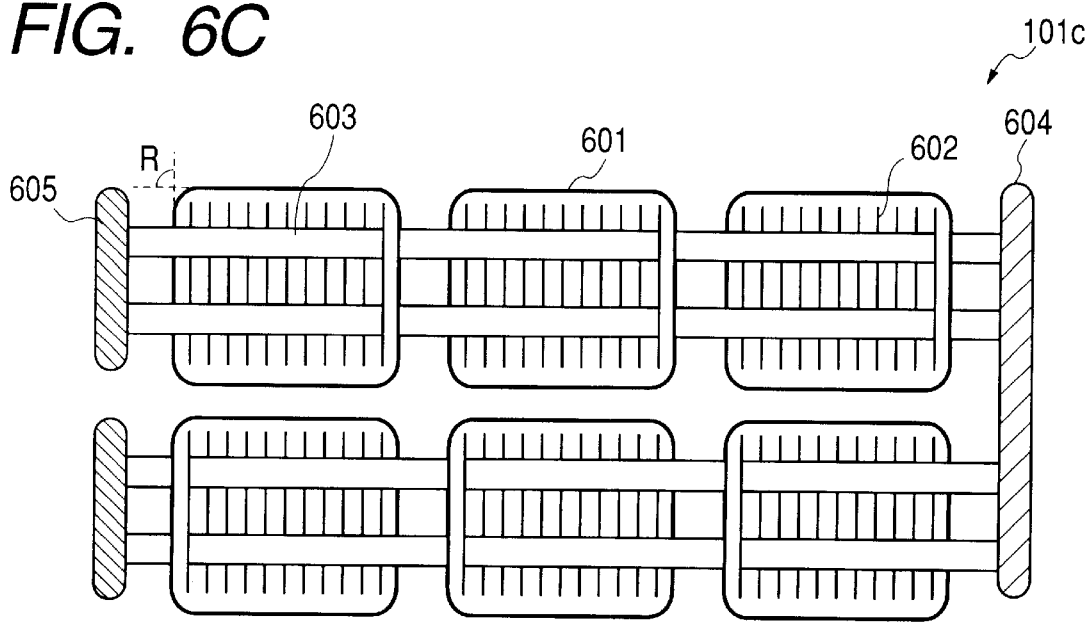

The most significant characteristic of the present invention is the shape of the photovoltaic device assembly 101 and some examples of it are shown in FIGS. 6A to 6C. Incidentally, in the figures, the reference numeral 601 denotes a photovoltaic device, 602 a collector electrode, 603 a bus bar electrode, 604 a connection electrode, 605 a terminal-leading out electrode, and the reference character R denotes an extended corner.

The photovoltaic device assembly 101 (101a, 101b, 101c) is composed of a plurality of photovoltaic devices. The photovoltaic device assembly 101 has no rectangular corner part in the peripheral parts. If there is no rectangular corer part in the peripheral parts as shown in the photovoltaic device assembly 101a illustrated in FIG. 6A, the photovoltaic device assembly may have rectangular corner parts 606 in the inside. Further, preferably, if the shape of the peripheral parts of photovoltaic devices 601 constituting each respective photovoltaic device assembly 101b, 101c is composed of straight lines and curved lines and no rectangular corner parts, as shown in FIG. 6B or FIG. 6C, the above described penetration phenomenon of the photovoltaic device assembly can further effectively be prevented.

The formation method of such a photovoltaic device differs depending on the embodiments of solar cells. Hereinafter, more particular description will be given regarding an amorphous type solar cell and a crystalline solar cell.

<Amorphous silicon type solar cell>

Figure 7:
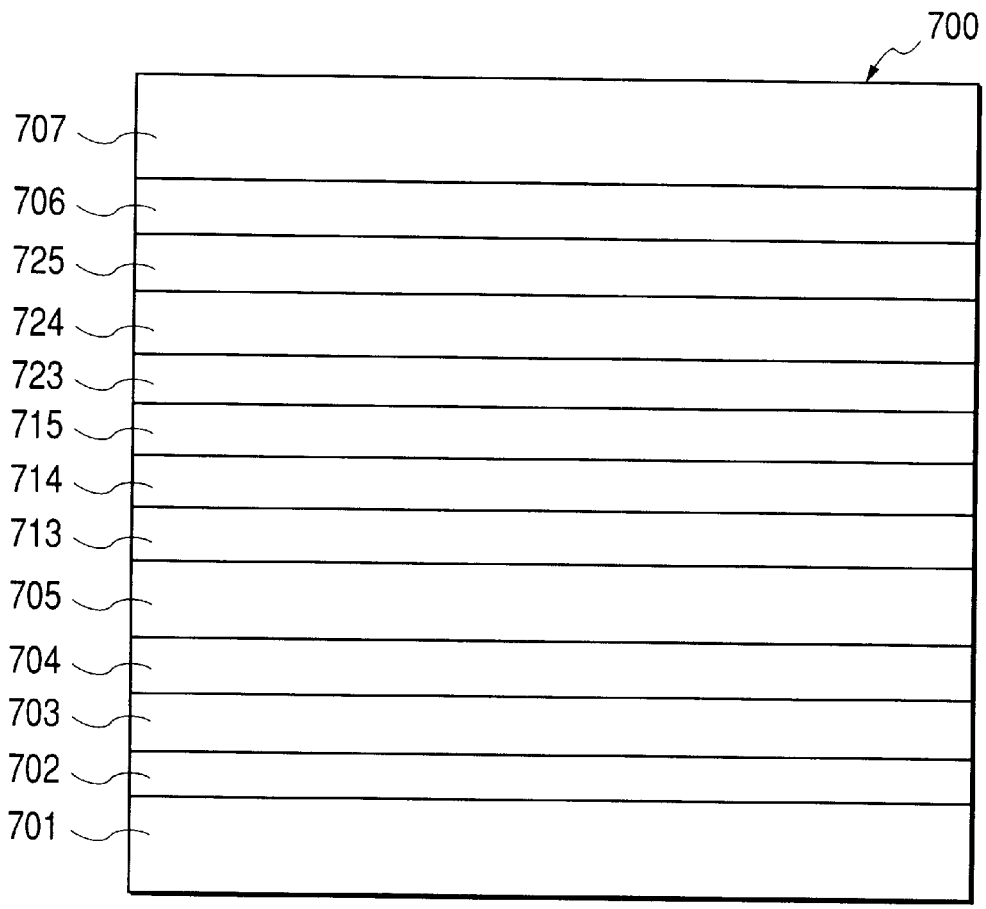
FIG. 7 is a schematic cross-section figure showing one example of an amorphous silicon type solar cell usable for the present invention.

FIG. 7 is a schematic cross-section figure showing an amorphous silicon type solar cell 700 in which light impinging from the opposed side to the substrate. In FIG. 7, the reference numeral 701 denotes a substrate, 702 a lower electrode, 703, 713, and 723 each n-type semiconductor layer, 704, 714, and 724 each i-type semiconductor layer, 705, 715, and 725 each p-type semiconductor layer, 706 an upper electrode, and 707 a collector electrode.

(Substrate)

The substrate 701 is a member for mechanically supporting a semiconductor layer in the case of a solar cell comprising a thin film of amorphous silicon or the like. Consequently, the substrate 701 is required to have a heat resistance durable to the heating temperature at the time of forming a semiconductor layer. Further, if the substrate works also as an electrode, a conductive one is employed.

Usable as a conductive material for the substrate are, for example, thin sheets of metals such as Fe, Ni, Cr, Al, Mo, Au, Nb, Ta, V, Ti, Pt, Pb and the like, of their alloys such as brass, stainless steel and the like, of their composites, a carbon sheet, a galvanized steel sheet, and the like.

Usable as an electrically insulating material to be used for the substrate are films or sheets of heat resistant synthetic resin such as polyesters, polyethylene, polycarbonates, cellulose acetate, polypropylene, polyvinyl chloride, polyvinylidene chloride, polystyrene, polyamides, polyimides, epoxy resin and the like, glass, ceramics and the like.

Other than those to be used for the substrate, usable examples are composite bodies of heat resistant synthetic resin with glass fiber, carbon fiber, boron fiber, metal fiber, and the like, and further metal thin sheets, resin sheets and the like whose surface is coated with a different type of metal thin sheets and/or an insulating thin film of such as $SiO_2$, $Si_3N_4$, $Al_2O_3$, AlN and the like by surface coating treatment by such as a sputtering method, an evaporation method, a plating method and the like.

(Lower electrode)

The lower electrode 702 is one electrode for taking out electric power generated in a semiconductor layer and is required to have a work function as to form an ohmic contact with the semiconductor layer.

The material usable for the lower electrode 702 are, for example, metal single substances, alloys and transparent conductive oxides (TCO) such as Al, Ag, Pt, Au, Ni, Ti, Mo, Fe, V, Cr, Cu, a stainless steel, brass, Nichrome alloy, $SnO_2$, $In_2O_3$, ZnO, ITO and the like.

The lower electrode 702 is preferable to have a smooth surface, however if the light has to be diffused and reflected, the surface may be subjected to texture treatment. Further if the substrate 701 is conductive, the lower electrode 702 is not necessarily required to be installed.

Applicable for the formation method of the lower electrode 702 may be plating, evaporating, sputtering methods and the like.

(Semiconductor layer)

Usable to be employed as the amorphous silicon semiconductor layer is not only those with a triple constitution having pin junction as shown in FIG. 7 but also those with a double constitution comprising layered pin junctions or pn junctions or with a single constitution. Particularly preferable semiconductor materials forming the i-type semiconductor layers 704, 714, 724 are so-called group IV elements-based and group IV element alloys-based amorphous semiconductors such as a-SiGe, a-SiC and the like other than a-Si.

Based on the necessity, the well-known following methods are employed as a film formation method of an amorphous silicon semiconductor layer; an evaporation method, a sputtering method, a high frequency plasma CVD method, a micro plasma CVD method, an ECR method, a thermal CVD method, an LPCVD method. A batch type apparatus and a continuous film formation apparatus can be used as a film formation apparatus, based on the necessity.

If a batch type apparatus is employed, it is preferable to use a substrate whose peripheral parts are previously composed of straight lines and curved lines and have no rectangular corner part, since it requires no processing after the film formation. On the other hand, in the case where a large scale substrate is cut after film formation if a continuous type film formation apparatus is employed, processing may be carried out as to make peripheral parts of a substrate composed of straight lines and curved lines and have no rectangular corner part after the film formation.

(Upper electrode)

The upper electrode 706 is an electrode for taking out electromotive force generated in a semiconductor layer and coupled with the lower electrode 702. The upper electrode 706 is necessary in the case of using a semiconductor like an amorphous silicon with a high sheet resistance and in the case of a crystalline solar cell, it is not necessarily required since the sheet resistance is low. Further the upper electrode 706 is required to be transparent since it is positioned in the light incident side and therefore it is sometimes called as a transparent electrode.

The upper electrode 706 is desirable to have light transmittance of 85% or higher to the light rays from the sun or an incandescent lamp as to efficiently absorb the light rays in a semiconductor layer and further the upper electrode 706 is desirable to have a sheet resistance value of $100\Omega/\square$ or lower as an electric property so as to pass electric current generated by the light radiation in the semiconductor layer in the transverse direction. Materials provided with such properties are metal oxides such as $SnO_2$, $In_2O_3$, ZnO, CdO, $CdSnO_4$, ITO ($In_2O_3+SnO_2$) and the like.

(Collector electrode)

The collector electrode 707 is generally formed to be like a comb and proper width and pitches may be determined depending on the sheet resistance values of the semiconductor layer and the upper electrode 706.

The collector electrode 707 is required to have a low specific resistance and not to form a series of resistors with the solar cells and the preferable specific resistance is $10^{-6}$ $\Omega$cm to $10^{-2}$ $\Omega$cm.

Usable materials for the collector electrode 707 are, for example, metals such as Ti, Cr, Mo, W, Al, Ag, Ni, Cu, Sn, Pt and the like, their alloys, and solders. Generally a metal paste containing a metal powder and a polymer resin binder in a paste state is used, however it is not restricted to that.

<Crystalline Silicon Solar Cell>

Figure 8:
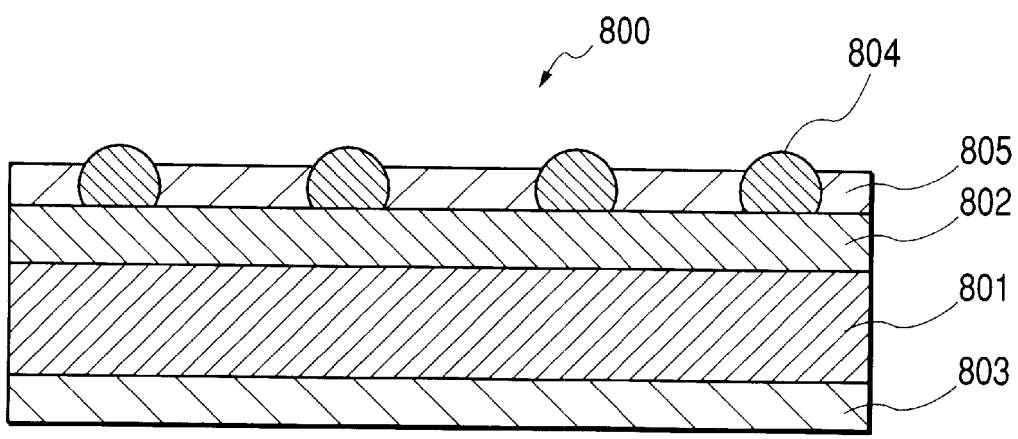
FIG. 8 is a schematic cross-section figure showing one example of a crystalline silicon type solar cell usable for the present invention.

FIG. 8 shows a schematic cross-section figure of a crystalline silicon solar cell 800 of single crystal silicon and polycrystalline silicon. In FIG. 8, the reference numeral 801 denotes a semiconductor layer of a silicon substrate, 802 a semiconductor layer forming a pn junction with the semiconductor layer 801, 803 a back electrode, 804 a collector electrode, and 805 an anti-reflection film.

In the case of a single crystal silicon solar cell and of a polycrystalline silicon solar cell, the single crystal wafer and the polycrystalline wafer work as a substrate without requiring installation of a supporting substrate.

The single crystal silicon wafer can be obtained by a method of cutting a silicon ingot pulled by a CZ method. The shape of the obtained silicon ingot is generally cylindrical and cutting the ingot gives the single crystal silicon wafer. In the present invention, the obtained cylindrical silicon ingot may previously be processed by polishing or abrading as to change the round shape of the cross-section to a shape having no rectangular corner part in the peripheral parts in a photovoltaic device assembly and then cut to obtain a single crystal silicon wafer composing the photovoltaic device assembly. Alternatively, the obtained cylindrical silicon ingot may previously be processed by polishing or abrading as to change the round shape of the cross-section to a shape having straight lines and curved lines and no rectangular corner part in the peripheral parts in a photovoltaic device assembly and then cut to obtain a single crystal silicon wafer composing the photovoltaic device assembly. Further alternatively, the cylindrical silicon ingot is cut to obtain a circular single crystal silicon wafer and then the peripheral parts are polished and abraded to obtain a single crystal silicon wafer having a shape with which no rectangular corner part exists in the peripheral parts of a photovoltaic device assembly. Furthermore alternatively, the cylindrical silicon ingot is cut to obtain a circular single crystal silicon wafer and then the peripheral parts are polished and abraded to obtain a single crystal silicon wafer having a shape composed of straight lines and curved lines and having no rectangular corner part.

In the case of polycrystalline silicon wafer, methods available are a casting method of cutting an silicon ingot molded by dies or a ribbon method of obtaining a sheet-like polycrystal.

In the casting method, those with a shape with which no rectangular corner part is formed in the peripheral parts of a photovoltaic device assembly are used as dies for forming the ingot and a silicon ingot obtained using such dies is cut to obtain a polycrystalline silicon wafer composing a photovoltaic device assembly of the present invention. Alternatively, those with a shape with which the peripheral parts of photovoltaic devices can be composed of straight lines and curved lines with no rectangular corner part are used as dies for forming the ingot and a silicon ingot obtained using such dies is cut to also obtain a polycrystalline silicon wafer composing a photovoltaic device assembly of the present invention. Further alternatively, a polycrystalline silicon wafer composing a photovoltaic device assembly of the present invention can also be obtained by cutting a rectangular silicon ingot and polishing and abrading the obtained polycrystalline silicon ingot as to make the peripheral parts of a photovoltaic device assembly free from rectangular corner parts. Furthermore alternatively, a polycrystalline silicon wafer composing a photovoltaic device assembly of the present invention can also be obtained by cutting a rectangular silicon ingot and polishing and abrading the obtained polycrystalline silicon ingot as to make the peripheral parts of a photovoltaic device assembly composed of straight lines and curved lines with no rectangular corner part.

In the ribbon method, at the time of cutting a sheet-like polycrystalline silicon wafer, the cutting is so carried out as to give a shape having no rectangular corner part in the peripheral parts of a photovoltaic device assembly, so that a polycrystalline silicon wafer composing a photovoltaic device assembly of the present invention can be obtained. Alternatively, a sheet-like polycrystalline silicon wafer is cut in a rectangular shape and then polished and abraded as to have a shape with which the peripheral parts are composed of straight lines and curved lines with no rectangular corner part and thus a polycrystalline silicon wafer composing a photovoltaic device assembly of the present invention can also be obtained.

Those usable as a method for forming the pn junction are, for example, a vapor phase dispersion method using, for example, $POCl_3$, an application diffusion method using $TiO_2$, $SiO_2$, or $P_2O_5$ and an ion implantation method of carrying out directly doping with ion to obtain the semiconductor layer 802.

The back electrode 803 is formed by forming a metal film by, for example, an evaporation method or a sputtering method or by a screen printing using a silver paste.

The anti-reflection film 805 is formed as to prevent deterioration of the efficiency attributed to light reflection on the solar cell surface and the materials usable are, for example, $SiO_2$, $Ta_2O_5$, $Nb_2O_5$ and the like.

Then, photovoltaic devices manufactured by the above described techniques are connected in series or in parallel corresponding to the voltage or the current required to compose a photovoltaic device assembly. In this case, the photovoltaic devices may be integrated on an insulated substrate to obtain a desired voltage or current. Further if electrodes to be employed in that case are installed in the peripheral parts of the photovoltaic device assembly, the electrodes are preferable to have no rectangular corner part in the peripheral parts.

In a photovoltaic device assembly manufactured in such a manner, if the thickness of photovoltaic devices is 50 $\mu$m or thicker, the effect of the present invention is significant.

That is, since the rigidity of the photovoltaic devices themselves is lost in the case where the thickness of the photovoltaic devices is thinner than 50 $\mu$m and therefore even if force is applied from the outside to the photovoltaic devices, the photovoltaic devices are easily bent subsequently to the force application. For that, even if the photovoltaic devices have rectangular corners, the penetration phenomenon or the like hardly takes place.

As described above, a photovoltaic device assembly of the present invention has a shape as shown in FIG. 6. In this case, as being shown in, for example, FIG. 6A, in each photovoltaic device 601 composing the photovoltaic device assembly 101a, if the angle (hereinafter defined as an extension angle R) is 100° or narrower at a crossing point of extended lines of mutually neighboring two straight lines positioned in the peripheral parts of the photovoltaic device assembly, the effect of the present invention is significant. Or, as being shown in, for example, FIG. 6C, in each photovoltaic device 601 composing the photovoltaic device assembly 101c, if the extension angle R is 100° or narrower at crossing points of extended lines of not only mutually neighboring two straight lines positioned in the peripheral parts of the photovoltaic device assembly but also all of mutually neighboring two straight lines of the peripheral parts of the photovoltaic devices, the effect of the present invention is significant.

That is, in the case where the foregoing extension angle R is wider than 100°, even if the parts having the extension angle R are not formed to be curved, the penetration phenomenon does not so noticeably take place. However, in the case where the foregoing extension angle R is 100° or narrower, if the parts having the extension angle R are not formed to be curved, the penetration phenomenon considerably takes place. That is because the rectangular corner parts are acute in the case where the angle of the rectangular corners is 100° or narrower.

In this way, forming the shape of the photovoltaic devices according to the present invention can prevent the penetration phenomenon, which has conventionally been easy to take place in photovoltaic devices having rectangular corners with 100° or narrower angles and results in increase of the planning option of a photovoltaic device assembly, a solar cell module, and a manufacture method of the solar cell module.

Further, it is desirable that the curvature radius in the curved parts formed in the peripheral parts of each photovoltaic device or a photovoltaic device assembly is not shorter than 1 mm and not longer than 100 mm. That is because if the curvature radius is shorter than 1 mm, the effect of preventing penetration is diminished. On the other hand, that is because if the curvature radius is longer than 100 mm, the shape of each photovoltaic device becomes large and the shape of each photovoltaic device is to be restricted.

Further, in the case where the substrate of each photovoltaic device is of an inorganic material and the photovoltaic device has rectangular corners, the penetration phenomenon noticeably takes place. That is because a substrate of an organic material is rich in flexibility and low in hardness as compared with those of an inorganic material, the penetration phenomenon or the like is difficult to take place. Consequently, the present invention is much more effective in the case where the substrate of each photovoltaic device is of an inorganic material.

Next, description will be given again with reference to FIG. 1, regarding the constitution of a solar cell module using a photovoltaic device assembly of the present invention manufactured by the above described method.

(Outermost back face member)

The outermost back face member 105 is used for keeping electric insulation of a conductive substrate of a photovoltaic device assembly 101 from the outside. Those preferable to be used as the material of the member are glass and insulating resin which can retain sufficient electric insulation property to the conductive substrate, can be durable for a long duration and withstand the thermal expansion and thermal contraction. Especially, nylon, polyethylene terephthalate (PET), and the like are useful for films suitable as materials having flexibility as well for the outermost back face member 105. Further, in order to increase the mechanical strength of the solar cell module or in order to prevent the strain and the warp owing to the temperature alteration, a reinforcing plate may be stuck to the outside of the outermost back face member 105. As the reinforcing plate, suitable to be used are a steel plate, a plastic plate, and a FRP (glass fiber-reinforced plastic) plate.

In the case where a photovoltaic device assembly 101 of the present invention has a shape for preventing the penetration of the outermost back face member 105 and a polymer material, such as nylon, polyethylene terephthalate (PET) or the like, which is relatively easy to be penetrated is used for the outermost back face member 105, the most effective effect can be provided in the present invention.

(Outermost surface member)

The outermost surface member 103 is preferable to have properties such as weathering resistance, a water repelling property, an anti-stain property, and a mechanical strength as well as capability of retaining long-term durability of the solar cell module under exposure in outdoors since the outermost surface member 103 is positioned in the outermost layer of the solar cell module. The materials suitable to be used as the outermost surface member 103 are, for example, glass materials, fluororesin films of such as a tetrafluoroethylene ethylene copolymer (ETFE), polyvinyl fluoride resin (PVF), polyvinylidene fluoride resin (PVDF), polytetrafluoroethylene resin (TFE), tetrafluoroethylene hexafluoropropylene copolymer (FEP), polytrifluorochloroethylene resin (CTFE), and the like, and acrylic resin films of such as polymethyl methacrylate (PMMA) and the like.

Especially, in the case where a photovoltaic device assembly 101 having a shape for preventing the penetration of the outermost surface member 103 is used for a solar cell module in which a polymer material such as a fluororesin film, an acrylic resin film or the like, which is relatively easy to be penetrated is used for the outermost surface member 103, the most effective effect can be provided in the present invention.

In the case where resin is used for the outermost surface member 103, in order to surely maintain the mechanical strength to the stress from the outside, the thickness of the surface film has to be made thick to a certain extent and on the other hand, it is not desirable to be too thick in terms of the cost, and therefore the thickness is practically preferable to be 10 to 200 $\mu$m and further preferable to be 25 to 100 $\mu$m. Also, in order to improve the adhesion strength to a filler, it is desirable to subject the surface film to corona discharge treatment, plasma treatment, chemical treatment and the like.

(Surface filler)

The surface filler 102 is preferable to have properties as to cover the unevenness of a photovoltaic device assembly 101 with resin, protect devices from severe outside environments such as temperature changes, humidity, impact, scratch and the like and keep the adhesion between outermost surface member 103 and the photovoltaic device assembly 101. Further, it is also preferable to suppress the decrease of the quantity of light rays reaching the photovoltaic devices to the minimum. Consequently, the surface filler 102 is preferable to be provided with weathering resistance, adhesion strength, a filling property, heat resistance, impact resistance, scratching resistance, transparency, and the like. Polyolefin copolymers are suitable for the resin satisfying these requirements and practically, those excellent in the weathering resistance, adhesion strength, a filling property, and transparency are ethylene vinyl acetate copolymer (EVA), ethylene (meth) acrylic acid ester copolymers, ethylene (meth)acrylic acid copolymers, ethylene (meth)acrylic acid ester multicomponent copolymers, ethylene (meth)acrylic acid multicomponent copolymers and the like and as the (meth)acrylic acid ester, methyl (meth)acrylate and ethyl (meth)acrylate are preferable owing to their transparency.

Further, as means for increasing the heat resistance of the surface filler 102, resin may be cross-linked. Such cross-linking is generally carried out using organic peroxides in the case of ethylene vinyl acetate (EVA) copolymer. Also, in order to efficiently carry out the foregoing cross-linking, a cross-linking agent is preferable to be used.

In order to provide stability at a high temperature, the resin of the surface filler 102 is often mixed with a thermal oxidation preventive agent. Further, although the material to be used preferably for the surface filler of the present invention is excellent in the weathering resistance, in order to further improve the weathering resistance or to protect the lower layer of the surface filler, an ultraviolet absorbing agent can be used in combination. Further, for the method for providing weathering resistance other than addition of the ultraviolet absorbing agent, a hindered amine type photostabilizer is known to be used and significant cooperative effects can be provided by using it in combination with the ultraviolet absorbing agent. Of course, substances possible to function as photostabilizers are available other than the hindered amine type ones, many are sometimes colored and therefore not preferable for the surface filler of the present invention.

Incidentally, taking the use environment of the solar cell module into consideration, it is preferable to use an ultraviolet absorbing agent, a photostabilizer, and a thermal oxidation preventive agent with scarcely volatile properties.

On the other hand, in order to suppress the decrease of the quantity of light reaching the photovoltaic devices as much as possible, the entire light ray transmittance of the surface filler 102 is preferably 80% or higher in the visible light wavelength region from 400 nm to 800 nm inclusive and further preferably 90% or higher. Further, in order to make light easily impinge from the atmosphere, the refractive index is preferably 1.1 to 2.0 and further preferably 1.1 to 1.6.

(Back filler)

The back filler 104 is for keeping the photovoltaic device assembly 101 and the outermost back face member 105 adhering to each other. The materials for it is preferable to be those possible to reliably keep sufficient adhesion strength to the substrate of each photovoltaic device and provided with long-term durability, excellently resistance to thermal expansion and thermal contraction, and flexibility.

The materials suitable to be used for the back filler 104 are practically hot melt materials such as ethylene vinyl acetate copolymer, ethylene (meth)acrylic acid ester copolymers, ethylene (meth)acrylic acid copolymers, ethylene (meth)acrylic acid ester multi-component copolymers, ethylene (meth)acrylic acid multi-component copolymers, polyvinyl butyral and the like, a double-sided tape, an epoxy adhesive having flexibility and the like.

As means for further improving the adhesion strength of the surface filler 102 and the back filler 104 to the photovoltaic device assembly 101, the outermost surface member 103, and the outermost back face member 105, the fillers may be mixed with a silane coupling agent and a coupling agent of an organic titanate compound based on the necessity.

A manufacture method of a solar cell module using the above described constituent materials will be described below.

The manufacture method of a solar cell module of the present invention can be selected from a variety of conventionally well-known methods such as a vacuum lamination method, a roll lamination method and the like. The effect of the manufacture method of a solar cell module of the present invention is especially significant in the case of employing the roll lamination method. Hereinafter, the manufacture method will be described while exemplifying the roll lamination method.

Figure 9:
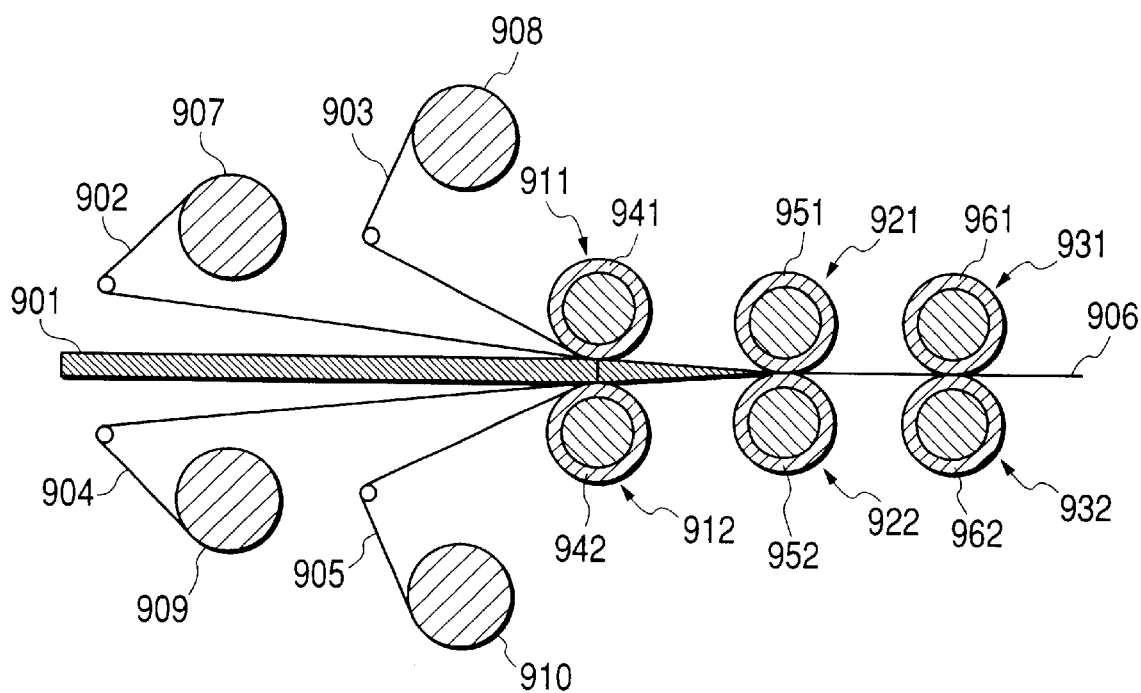
FIG. 9 is a schematic diagram showing one example of a manufacture method of a solar cell module of the present invention employing a roll lamination method.

FIG. 9 is a schematic diagram of a roll laminator apparatus. In FIG. 9, the reference numeral 901 denotes a photovoltaic device assembly of the present invention, 902 a surface filler, 903 a outermost surface member, 904 a back filler, 905 a outermost back face member, 906 a solar cell module, 907 a surface filler roll, 908 a outermost surface member roll, 909 a back filler roll, 910 a outermost back face member roll, 911 a first stage upper heating roller, 912 a first stage lower heating roller, 921 a second stage upper heating roller, 922 a second stage lower heating roller, 931 a cooling upper roller, 932 a cooling lower roller, 941, 942, 951, 952, 961, 962 are rubber.

At first, the outermost surface member 903, the surface filler 902, the back filler 904, and the outermost back face member 905 are supplied to the first stage heating roller position. At that time, the outermost surface member 903 and the outermost back face member 905 may be integrated with the surface filler 902 and the back filler 904, respectively. Then, the photovoltaic device assembly 901 of the present invention is supplied to the first stage heating roller as to be arranged between the surface filler 902 and the back filler 904. The resulting layered body is heated between the first stage upper heating roller 911 and the first stage lower heating roller 912 and the heated layered body is supplied to the second stage heating roller part to be heated by the second stage upper heating roller 921 and the second stage lower heating roller 922 and at the same time to be pressurized by the second stage upper heating roller 921 to carry out thermal compression bonding of the layered body. After that thermal compression bonding, the resulting layered body is supplied to the cooling roller part to be cooled and thus the solar cell module 906 of the present invention can be obtained.

Hereinafter, the present invention will be described in details according to examples, however the present invention is not at all restricted to the examples and may include a variety of variations within the true scope of the invention.

EXAMPLE 1

A washed stainless steel was used as a substrate and a back anti-reflection layer was formed on the stainless steel substrate by a sputtering method and after that, an amorphous silicon photoelectric conversion semiconductor layer was formed by a well-known plasma CVD method. A transparent electrode layer was formed on the obtained amorphous silicon photoelectric conversion semiconductor layer and further collector electrodes were installed to obtain an amorphous silicon photovoltaic device.

Just like a photovoltaic device shown in FIG. 6B, the shape of the stainless steel substrate used was composed of straight lines and curved lines in the peripheral parts and has no rectangular corner. The extension angle R in this case was 90° and the curvature radius was 3 mm. The thickness of the photovoltaic device was 200 μm.

Five sheets of the photovoltaic device obtained in such a manner were connected in series by bus bar electrodes 603 as shown in FIG. 6B to manufacture a photovoltaic device assembly 101b.

Next, using the photovoltaic device assembly, a solar cell module as shown in FIG. 1 was manufactured by a roll lamination method.

In the present example, ETFE (50 μm thickness) was used for the outermost surface member 103, EVA (450 μm thickness) for the surface filler 102, EVA (450 μm thickness) for the back filler 104, ETEF (50 μm thickness) for the outermost back face member 105 and they were thermally pressure-bonded to obtain a solar cell module composed of both-sided films.

Solar cell modules were also manufactured in the same manner while using photovoltaic devices having extension angles R of 80°, 100°, 108°, 120°, and 135°. These solar cell modules were manufactured in number of 100, respectively.

EXAMPLE 2

Solar cell modules were manufactured in number of 100, respectively, in the same manner as Example except that photovoltaic devices (R=90°) with the thickness of 20 μm, 30 μm, 40 μm, 50 μm, 80 μm, 100 μm, and 300 μm were employed.

EXAMPLE 3

A silicon ingot obtained by a conventionally well-known casting method was cut and polished and abraded to obtain polycrystalline silicon wafers and using the wafers, polycrystalline silicon photovoltaic devices as shown in FIG. 8 were manufactured. Each of the photovoltaic devices had an extension angle R of 90°, the curvature radius of 5 mm, and the thickness of 250 μm.

Solar cell modules in number of 100 were manufactured in the same manner as Example 1 while using photovoltaic device assembles in which the polycrystalline silicon photovoltaic devices obtained in such a manner were connected in series as shown in FIG. 6C.

EXAMPLE 4

Figure 13:
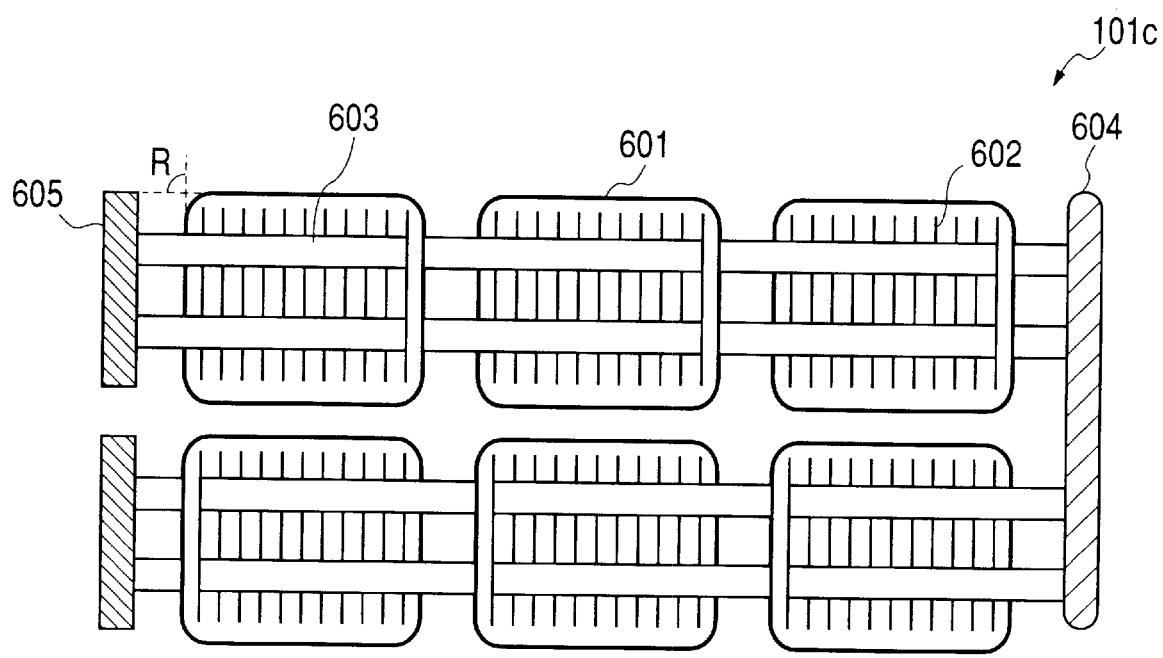
FIG. 13 is a plan view schematically showing a shape example of a photovoltaic device assembly of the present invention.

As shown in FIG. 13, solar cell modules were manufactured in the same manner as Example 3 except that terminal-leading out electrodes 605 had rectangular corners and penetration evaluation was carried out. In Example 4, a 100 $\mu$m-thick soft copper foil was used as the terminal-leading out electrodes 605.

Comparative Example 1

Solar cell modules in number of 100, respectively, were manufactured in the same manner as Example 1 except that photovoltaic devices used had an parallelogram shape of interior angles of 80°, 100°, rectangle shape (the interior angle 90°), a right pentagonal shape (the interior angle 108°), a right hexagonal shape (the interior angle 120°), and a right octagonal shape (the interior angle 135°) in the peripheral shape.

Comparative Example 2

Solar cell modules in number of 100, respectively, were manufactured in the same manner as Comparative example 1 except that photovoltaic devices (the interior angle 90°) used had the thickness of 20 $\mu$m, 30 $\mu$m, 40 $\mu$m, 50 $\mu$m, 80 $\mu$m, 100 $\mu$m, and 300 $\mu$m.

Comparative Example 3

A silicon ingot obtained by a conventionally well-known casting method was cut and polished and abraded to obtain polycrystalline silicon wafers and using the wafers, polycristalline silicon photovoltaic devices as shown in FIG. 8 were manufactured. Each of the photovoltaic devices had an interior angle of 90° and the thickness of 250 $\mu$m.

Figure 5A:
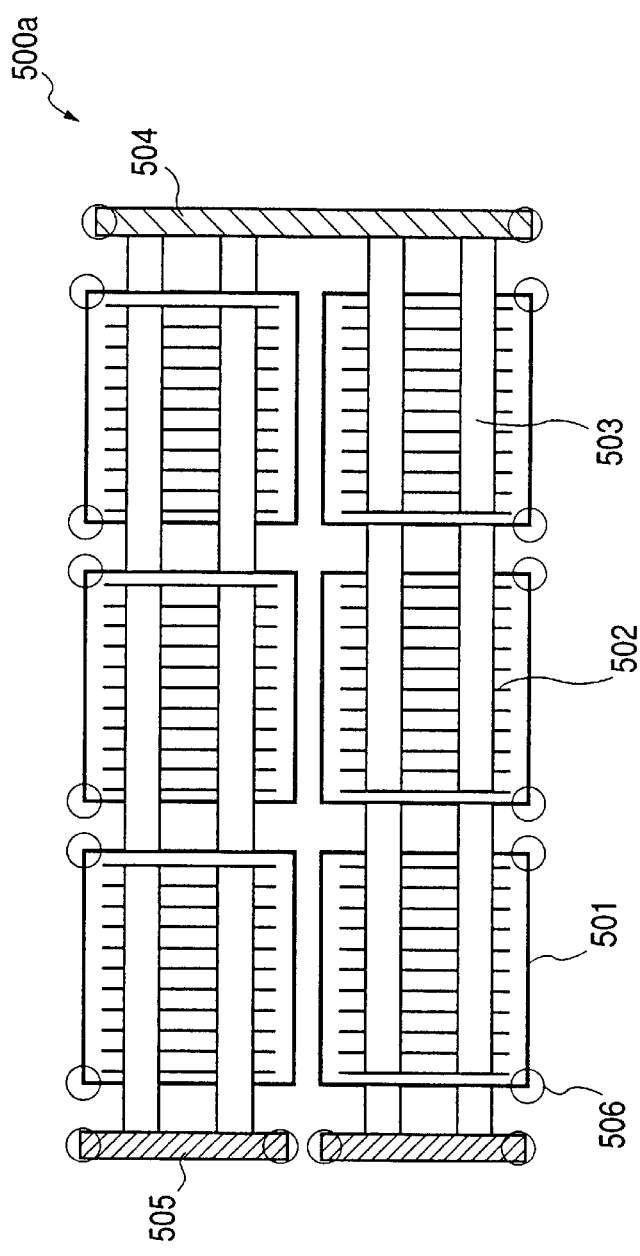
FIGS. 5A and 5B are plan views schematically showing the shape examples of conventional photovoltaic device assemblies.
Figure 5B:
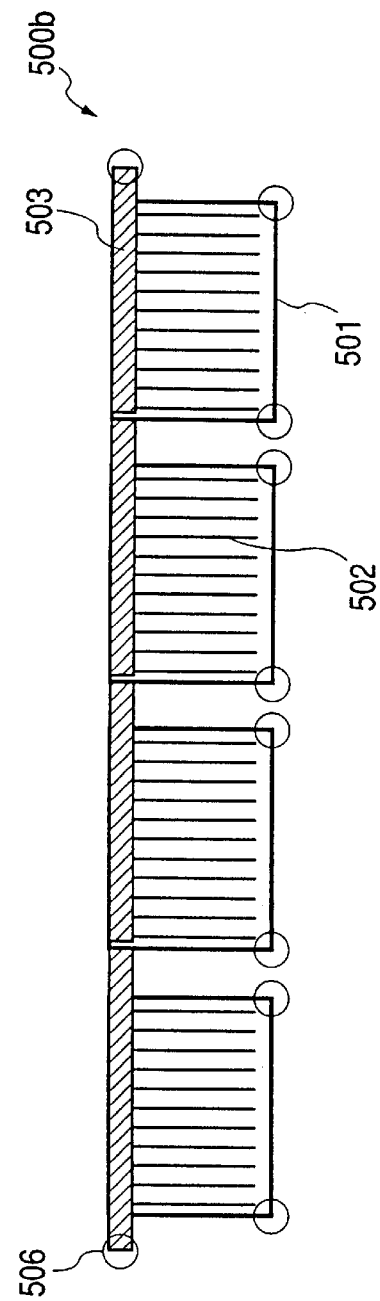

Solar cell modules in number of 100 were manufactured in the same manner as Comparative example 1 while using photovoltaic device assembles in which the polycrystalline silicon photovoltaic devices obtained in such a manner were connected in series as shown in FIG. 5A.

Regarding the solar cell modules in number of 100, respectively, obtained in the above described manner in Examples 1 to 3 and Comparative examples 1 to 3, Table 1 show the results of the defective ratios owing to the penetration by photovoltaic device assemblies after roll lamination and NG occurrence ratios in the following penetration test. Incidentally, regarding the solar cell modules of Examples 1 to 3, Table 1 also show the improved points (the comparison with those of Comparative examples 1 to 3 wherein the photovoltaic devices used have the interior angle of the rectangular corners same as the extension angle R and the same thickness) by the present invention.

The improved point in the module appearance after the roll lamination=the defective ratio of a comparative example–the defective ratio of an example.

The improved point in the penetration test result=the NG occurrence ratio of a Comparative example–the NG occurrence ratio of an example.

(The devices of an Example having the extension angle R equal to the interior angle of the rectangular corners of the devices of a Comparative example and the same thickness as that of the devices of a Comparative examples were compared with those of the Comparative examples.)

(Penetration test)

Figure 10:
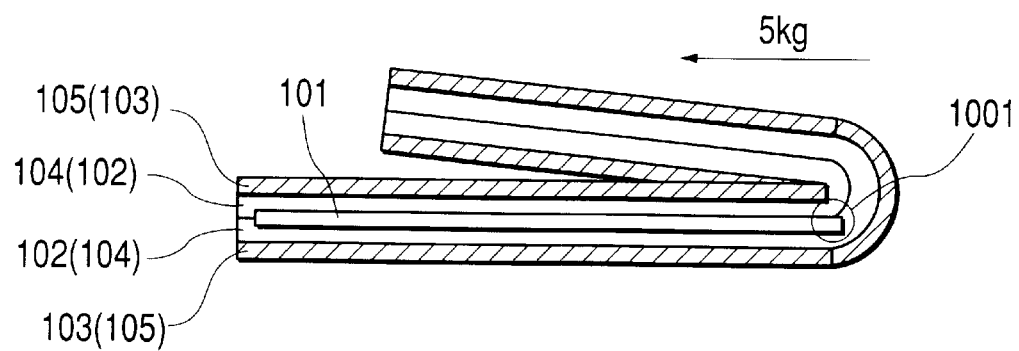
FIG. 10 is a diagrammatic figure showing a method for testing penetration in examples and comparative examples.

As shown in FIG. 10, in peripheral curved parts (or rectangular corners) 1001 of the photovoltaic device assembly 101, a solar cell module was subjected to 180° bending and 5 kg load application. At that time, those of which the photovoltaic device assemblies caused the penetration phenomenon were determined to be NG. Incidentally, the same numeral numbers are assigned to the members in FIG. 10 same as those in FIG. 1 and their description is therefore omitted.

As being made clear in Table 1, in the case where no rectangular corner was formed in the peripheral parts of photovoltaic device assemblies, especially in the case where the peripheral parts of the photovoltaic devices composing the photovoltaic device assemblies were composed of straight lines and curved lines and had no rectangular corner, the defective ratio by the penetration test and the defective ratio by the penetration at the time of solar cell module manufacture by the roll lamination method were remarkably improved.

Figure 11:
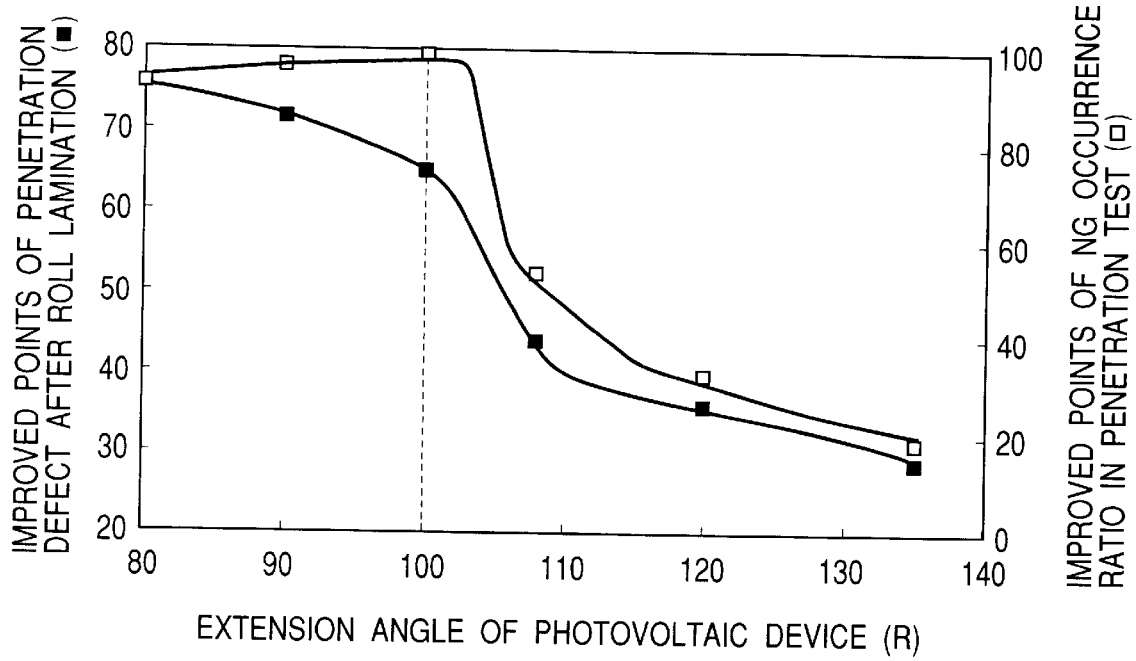
FIG. 11 is a graph showing points where penetration defects are improved and points where NG occurrence ratio in a penetration test Is improved after roll lamination is carried out to an extended angle R of a photovoltaic device of the example 1.

FIG. 11 is a graph showing the improved points of the photovoltaic devices composing the photovoltaic device assemblies of Example 1 in relation to the extension angle R in the penetration test and after lamination (comparison with Comparative example 1). Although the results are made understandable in Table 1, especially FIG. 11 makes it clear that the penetration phenomenon could remarkably effectively be prevented if the extension angle R of the photovoltaic devices was 100° or narrower, in comparison with that in the photovoltaic devices having the same interior angle in the rectangular corners as the extension angle R.

Figure 12:
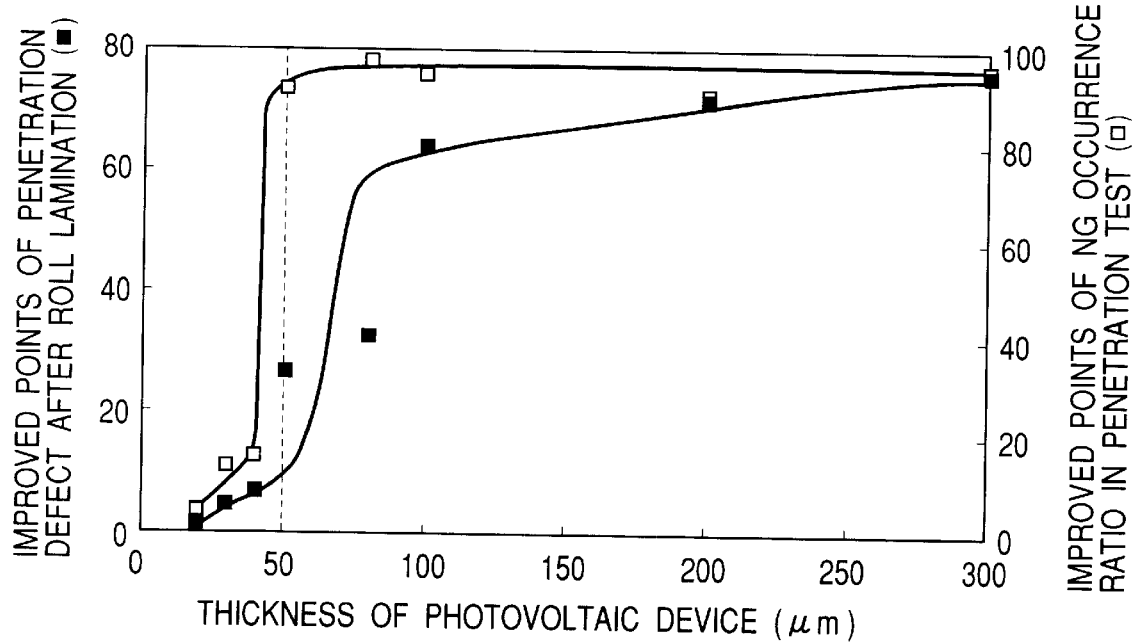
FIG. 12 is a graph showing points where penetration defects are improved and points where NG occurrence ratio in a penetration test is improved after roll lamination is carried out to the thickness of a photovoltaic device of the example 2.

FIG. 12 is a graph showing the improved points of the photovoltaic devices composing the photovoltaic device assemblies of Example 2 in relation to the thickness in the penetration test and after lamination (comparison with Comparative example 2). Although the results are made understandable in Table 1, especially FIG. 12 makes it clear that the penetration phenomenon could remarkably effectively be prevented if the thickness of the photovoltaic devices was 50 $\mu$m or thicker.

Polycrystalline silicon wafers were used in Example 3 and Comparative example 3. In the solar cell modules of Comparative example 3 in which the peripheral parts of the photovoltaic device assemblies, especially in the peripheral parts of the photovoltaic devices had rectangular corners as same in the case where stainless steel substrate was used, the penetration phenomenon occurs and on the other hand, in the solar cell modules of Example 3 in which the photovoltaic devices were so made as to have shapes composed of straight lines and curved lines and having no rectangular corner, the penetration phenomenon could be prevented as same in the case where a stainless steel substrate was used.

Further, in the case of Example 4, although there were rectangular corners in the terminal-leading out electrodes, no significant difference was observed in the NG occurrence ratio in the penetration test and the appearance deterioration ratio after the roll lamination. That is supposedly attributed to that the terminal-leading out electrodes employed for manufacturing the photovoltaic device assemblies were of a 100 $\mu$m-thick soft copper foil and had low rigidity as compared with that of photovoltaic devices.

A photovoltaic device assembly of the present invention has no rectangular corner in the peripheral parts and owing to such a shape, it is made possible to provide a photovoltaic device excellent in safeness at the time of handling. Also, in a solar cell module manufactured using a photovoltaic device assembly of the present invention, since the peripheral parts of the photovoltaic device assembly have no rectangular corner, penetration of the covering members with photovoltaic devices owing to the effects of manufacture, installation, transportation, handing, and the state after installation of the solar cell module can be prevented and thus the solar cell module excellent in a long-term reliability in a variety of shapes can be obtained and a manufacture method excellent in the productivity and yield ratio can be provided.

point of the extended lines of two mutually neighboring straight lines among the straight lines composing the shape of the peripheral parts of the photovoltaic devices.

4. The photovoltaic device assembly according to claim 1, wherein the electrode tabs have no rectangular corner part in the peripheral parts of the electrode tabs themselves.

5. The photovoltaic device assembly according to claim 4, wherein the electrode tabs are any of bus bar electrodes, connection electrodes, and terminal-leading out electrodes.

6. The photovoltaic device assembly according to claim 1, wherein the thickness of the photovoltaic devices is 50 $\mu$m or thicker.

TABLE 1

| | Photovoltaic device | | | External appearance after roll lamination | | Penetration test result | |
|---|---|---|---|---|---|---|---|
| | Extension angle R (°) | Corner interior angle (°) | Thickness ($\mu$m) | Defective ratio (%) | Improved point by the invention | NG occurrence ratio (%) | Improved point by the invention |
| Example 1 | 80 | — | 200 | 5 | 76 | 7 | 93 |
| | 90 | — | 200 | 1 | 72 | 3 | 97 |
| | 100 | — | 200 | 0 | 65 | 1 | 99 |
| | 108 | — | 200 | 0 | 44 | 0 | 54 |
| | 120 | — | 200 | 0 | 36 | 0 | 33 |
| | 135 | — | 200 | 0 | 29 | 0 | 19 |
| Example 2 | 90 | — | 20 | 0 | 2 | 0 | 5 |
| | 90 | — | 30 | 0 | 5 | 0 | 14 |
| | 90 | — | 40 | 0 | 7 | 0 | 16 |
| | 90 | — | 50 | 0 | 27 | 3 | 92 |
| | 90 | — | 80 | 0 | 33 | 2 | 98 |
| | 90 | — | 100 | 1 | 64 | 5 | 95 |
| | 90 | — | 300 | 3 | 76 | 9 | 91 |
| Example 3 | 90 | — | 250 | 2 | 72 | 4 | 96 |
| Comparative example 1 | — | 80 | 200 | 81 | — | 100 | — |
| | — | 90 | 200 | 73 | — | 100 | — |
| | — | 100 | 200 | 65 | — | 100 | — |
| | — | 108 | 200 | 44 | — | 54 | — |
| | — | 120 | 200 | 36 | — | 33 | — |
| | — | 135 | 200 | 29 | — | 19 | — |
| Comparative example 2 | — | 90 | 20 | 2 | — | 5 | — |
| | — | 90 | 30 | 5 | — | 14 | — |
| | — | 90 | 40 | 7 | — | 16 | — |
| | — | 90 | 50 | 27 | — | 95 | — |
| | — | 90 | 80 | 33 | — | 100 | — |
| | — | 90 | 100 | 65 | — | 100 | — |
| | — | 90 | 300 | 79 | — | 100 | — |
| Comparative example 3 | — | 90 | 250 | 74 | — | 100 | — |

What is claimed is:

1. A photovoltaic device assembly comprising:
   a plurality of photovoltaic devices connected with one another, each of said photovoltaic devices having a substrate; and
   electrode tabs for extracting electric power from the plurality of photovoltaic devices, at least some portion of the electrode tabs being positioned at the periphery of the photovoltaic device assembly,
   wherein for exterior portions of the photovoltaic devices and the electrode tabs positioned in the periphery of the photovoltaic device assembly, no rectangular corner part is formed and the shape of the peripheral parts of the photovoltaic devices is composed of straight lines and curved lines connecting the straight lines to one another.

2. The photovoltaic device assembly according to claim 1, wherein the peripheral parts of the photovoltaic devices have no rectangular corner part.

3. The photovoltaic device assembly according to claim 2, wherein the interior angle is 100° or narrower at the crossing 7. The photovoltaic device assembly according to claim 1, wherein the substrates of the photovoltaic devices are of an inorganic material.

8. A solar cell module comprising a photovoltaic device assembly, the photovoltaic device assembly comprising:
   a plurality of photovoltaic devices connected with one another, each of said photovoltaic devices having a substrate; and
   electrode tabs for extracting electric power from the plurality of photovoltaic devices, at least some portion of the electrode tabs being positioned at the periphery of the photovoltaic device assembly,
   wherein a coating material is used to coat the photovoltaic device assembly, and
   wherein for exterior portions of the photovoltaic devices and the electrode tabs positioned in the periphery of the photovoltaic device assembly, no rectangular corner part is formed and the shape of the peripheral parts of the photovoltaic devices is composed of straight lines and curved lines connecting the straight lines to one another.

9. The solar cell module according to claim 8, wherein the peripheral parts of the photovoltaic devices have no rectangular corner part.

10. The solar cell module according to claim 9, wherein the interior angle is 100° or narrower at the crossing point of the extended lines of two mutually neighboring straight lines among the straight lines composing the shape of the peripheral parts of the photovoltaic devices.

11. The solar cell module according to claim 8, wherein the electrode tabs have no rectangular corner part in the peripheral parts of the electrode tabs themselves.

12. The solar cell module according to claim 11, wherein the electrode tabs are any of bus bar electrodes, connection electrodes, and terminal-leading out electrodes.

13. The solar cell module according to claim 8, wherein the thickness of the photovoltaic devices is 50 $\mu$m or thicker.

14. The solar cell module according to claim 8, wherein the substrates of the photovoltaic devices are of an inorganic material.

15. The solar cell module according to claim 8, wherein the solar cell module has flexibility.

16. The solar cell module according to claim 8, wherein the coating material comprises an outermost surface member, an outermost back face member, and fillers.

17. The solar cell module according to claim 16, wherein the outermost surface member is of a polymer material.

18. A manufacture method of a solar cell module comprising a photovoltaic device assembly constituted by connecting a plurality of photovoltaic devices with one another, each of said photovoltaic devices having a substrate, and the photovoltaic device assembly being coated with a coating material, wherein the photovoltaic device assembly has no rectangular corner part formed in the peripheral parts and the shape of the peripheral parts of the photovoltaic devices is composed of straight lines and curved lines connecting the straight lines to one another, and the photovoltaic device assembly and the coating material are thermally compression bonded with each other by a roll lamination method.

19. The manufacture method of a solar cell module according to claim 18, wherein no rectangular corner part is formed in the peripheral parts of the photovoltaic device itself.

20. The manufacture method of a solar cell module according to claim 19, wherein the interior angle is 100° or narrower at the crossing point of the extended lines of two mutually neighboring straight lines among the straight lines composing the shape of the peripheral parts of the photovoltaic devices.

21. The manufacture method of a solar cell module according to claim 18, wherein the photovoltaic device assembly further comprises electrode tabs having no rectangular corner part in the peripheral parts of the electrode tabs themselves.

22. The manufacture method of a solar cell module according to claim 21, wherein the electrode tabs are any of bus bar electrodes, connection electrodes, and terminal-leading out electrodes.

23. The manufacture method of a solar cell module according to claim 18, wherein the thickness of the photovoltaic devices is 50 $\mu$m or thicker.

24. The manufacture method of a solar cell module according to claim 18, wherein the substrates of the photovoltaic devices are of an inorganic material.

25. The manufacture method of a solar cell module according to claim 18, wherein the solar cell module has flexibility.

26. The manufacture method of a solar cell module according to claim 18, wherein the coating material comprises an outermost surface member, an outermost back face member, and fillers.

27. The manufacture method of a solar cell module according to claim 26, wherein the outermost surface member is of a polymer material.

* * * * *